(12) United States Patent
Djaja et al.

(10) Patent No.: US 8,085,076 B2
(45) Date of Patent: Dec. 27, 2011

(54) DATA RETENTION FLIP FLOP FOR LOW POWER APPLICATIONS

(75) Inventors: Gregory Djaja, Phoenix, AZ (US); Karthik Chandrasekharan, Chandler, AZ (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/217,390

(22) Filed: Jul. 3, 2008

(65) Prior Publication Data
US 2010/0001774 A1    Jan. 7, 2010

(51) Int. Cl.
*H03K 3/289* (2006.01)
(52) U.S. Cl. ......... 327/202; 327/199; 327/200; 327/203
(58) Field of Classification Search .......... 327/161, 327/185, 199–203, 208–212, 214, 218
See application file for complete search history.

(56) References Cited

U.S. PATENT DOCUMENTS

| | | | | |
|---|---|---|---|---|
| 6,246,265 B1 * | 6/2001 | Ogawa | | 326/95 |
| 6,492,854 B1 * | 12/2002 | Ku et al. | | 327/202 |
| 7,391,250 B1 * | 6/2008 | Chuang | | 327/211 |
| 2002/0011983 A1 * | 1/2002 | Yamazaki et al. | | 345/92 |
| 2003/0188241 A1 * | 10/2003 | Zyuban et al. | | 714/726 |
| 2004/0085846 A1 * | 5/2004 | Yokozeki et al. | | 365/226 |
| 2006/0152268 A1 * | 7/2006 | Flynn et al. | | 327/218 |
| 2007/0103217 A1 * | 5/2007 | Frederick et al. | | 327/218 |
| 2008/0115024 A1 * | 5/2008 | Wang et al. | | 714/731 |

FOREIGN PATENT DOCUMENTS

KR    2009040519 A   *   4/2009

* cited by examiner

*Primary Examiner* — Lincoln Donovan
*Assistant Examiner* — Brandon Cole
(74) *Attorney, Agent, or Firm* — Farjami & Farjami LLP

(57) ABSTRACT

A disclosed embodiment is a data retention flip flop comprising master and slave circuits that are configured to be turned off when a single sleep mode signal is activated. The disclosed embodiment also comprises an always-on balloon circuit coupled to the master circuit, where the always-on balloon circuit includes a common sub-circuit shared with the master circuit. The master circuit writes into the always-on balloon circuit when the single sleep mode signal is activated, and the master circuit reads from the always-on balloon circuit when the single sleep mode signal is deactivated. The always-on balloon circuits comprises high threshold voltage transistors, while the slave circuit comprises low threshold voltage transistors. The master and slave circuits have no leakage current, or substantially no leakage current, after the single sleep mode signal is activated.

11 Claims, 3 Drawing Sheets

DATA RETENTION FLIP FLOP FOR LOW POWER APPLICATIONS

BACKGROUND OF THE INVENTION

1. Field of the Invention

The present invention is generally in the field of semiconductor circuits. More particularly, the present invention relates to semiconductor circuits for low power applications.

2. Background Art

A conventional flip flop is a memory storage device that typically retains stored data as long as it is powered on (or "turned on"). While not in active use, but while still turned on and retaining stored data, the flip flop wastes power because transistors in the flip flop have leakage current. While turned off, the transistors have no leakage current, and thus the flip flop does not waste power, but the flip flop also loses stored data.

In an application using conventional flip flops in which power consumption is a design factor, such as in a low power mobile application, the amount of power wasted due to leakage current of inactive flip flops can be reduced in conventional ways. For example, the flip flops can be turned off while inactive, resulting in a power saving at the cost of losing stored data. Turning the flip flops back on for active use may involve reading data back into the flip flops from a nonvolatile source, resulting in increased circuit complexity and lost time. Alternatively, the flip flops can be implemented as conventional balloon flip flops, which in active use retain data in master and slave circuits, and while turned on but inactive (i.e., in a "sleep mode") retain data in conventional balloon circuits. In this alternative, fabrication of the balloon circuits requires a large number of additional components, and transferring data to and from the balloon circuits can require complex timing signals and circuitry. In both alternatives, the use of conventional flip flops results in various disadvantages such as, for example, increased complexity, increased cost, and/or reduced performance.

Thus, there is a need in the art for a data retention flip flop that overcomes disadvantages of conventional flip flops.

SUMMARY OF THE INVENTION

A data retention flip flop for low power applications, substantially as shown in and/or described in connection with at least one of the figures, and as set forth more completely in the claims.

DETAILED DESCRIPTION OF THE INVENTION

The present invention is directed to a data retention flip flop for low power applications. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
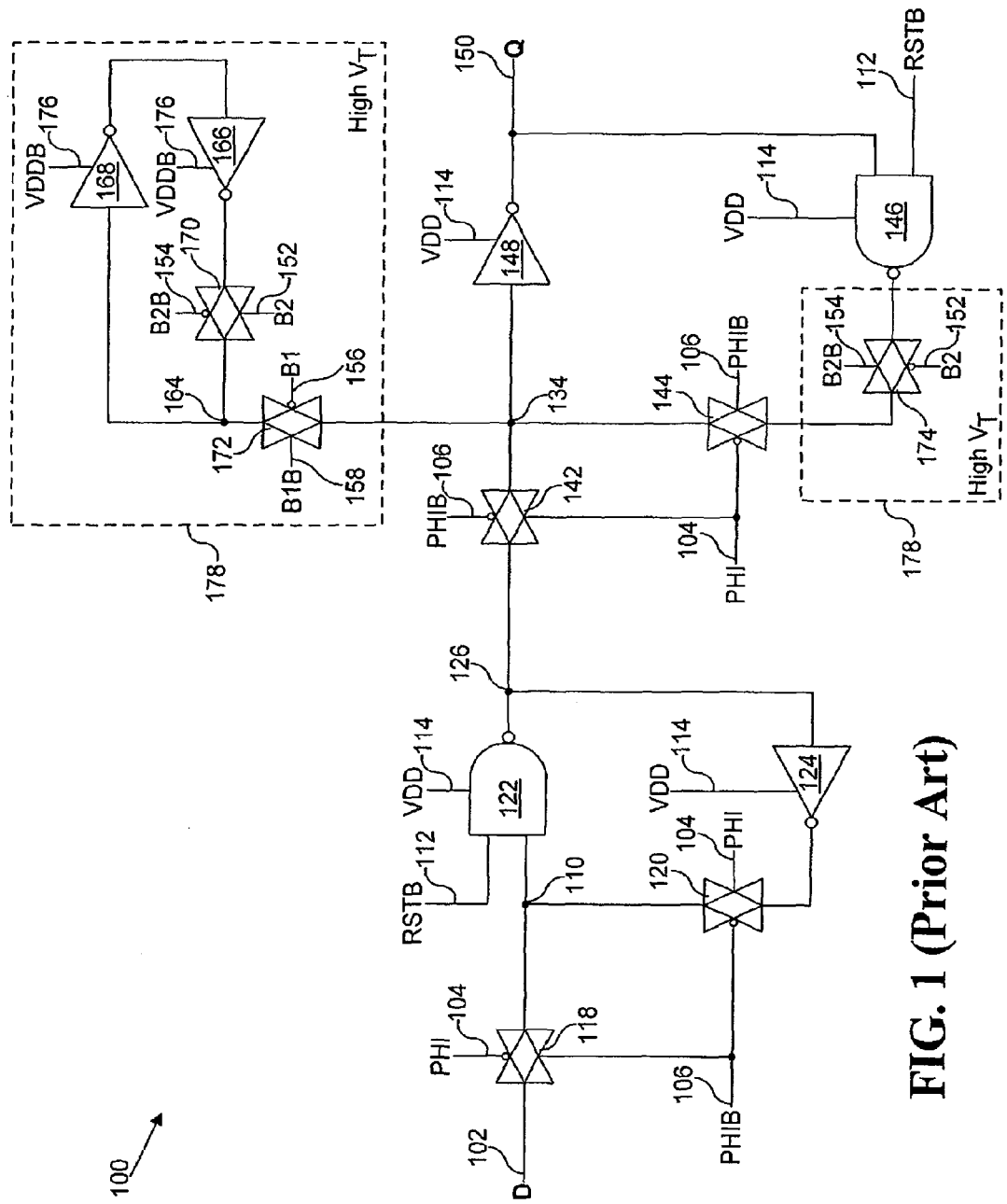
FIG. 1 shows an example of a conventional balloon flip flop.

A conventional balloon flip flop 100 is shown in FIG. 1. Flip flop 100 includes transmission gates 118, 120, 142, 144, 170, 172, and 174. Flip flop 100 additionally includes NAND gates 122 and 146, and inverters 124, 148, 166, and 168. Transmission gates 118 and 120, NAND gate 122, and inverter 124 comprise a master circuit of flip flop 100, transmission gates 142, 144, and 174, NAND gate 146, and inverter 148 comprise a slave circuit of flip flop 100, and transmission gates 170 and 172 and inverters 166 and 168 comprise a balloon circuit of flip flop 100.

Flip flop 100 receives an input signal on D 102, and provides an output signal on Q 150. NAND gates 122 and 146, and inverters 124 and 148, as well as other components in the master and slave circuits whose supply voltage lines are not specifically shown receive the supply voltage VDD 114. NAND gates 122 and 146 are also coupled to reset signal RSTB 112. Inverters 166 and 168 as well as other components in the balloon circuit whose supply voltage lines are not specifically shown receive the supply voltage VDDB 176. Transmission gates 118, 120, 142, and 144 are controlled by opposite clock signals PHIB 106 and PHI 104, and transmission gates 170, 172, and 174 are controlled by sleep signals B1 156, B1B 158, B2 152, and B2B 154, as shown in FIG. 1.

Typically, transmission gates 118, 120, 142, 144, 170, 172, and 174 are each implemented with a pair of NMOS and PMOS transistors, although the transmission gates may be implemented differently, for example, with a single transistor, as known in the art. In the present example, transmission gate 118, for example, comprises an NMOS transistor and a PMOS transistor with sources coupled to D 102, drains coupled to node 110, the PMOS gate coupled to clock PHI 104, and the NMOS gate coupled to clock PHIB 106. The sources, drains, and gates of transmission gates 120, 142, 144, 170, 172, and 174 are similarly configured.

In operation, flip flop 100 is turned on when the supply voltage VDD 114 is provided. While flip flop 100 is turned on, the master and slave circuits can store data and can be reset to store a logical zero value at output Q 150 by pulling RSTB 112 low. While flip flop 100 is turned on and in active use, a logical value present on D 102 will be stored in flip flop 100 and available on Q 150 in synchronization with clock signals PHIB 106 and PHI 104. Furthermore, during active use sleep signal B1 156 will be held high (and B1B 158 will be held low) so that transmission gate 172 decouples the balloon circuit from the slave circuit, and sleep signal B2 152 will be held low (and B2B 154 will be held high) so that transmission gate 174 couples the output of NAND gate 146 to transmission gate 144 in the slave circuit.

While flip flop 100 is in active use, opposite clocks PHI 104 and PHIB 106 control the latching of a logical value present on D 102 into the master circuit of flip flop 100. When clock PHIB 106 is high (and clock PHI 104 is low), a logical value present on D 102 can propagate through transmission gate 118 to NAND gate 122. The output of NAND gate 122 is provided through node 126 to the input of inverter 124, which outputs a signal that is blocked by transmission gate 120. When clock PHIB 106 transitions to low (and clock PHI 104 transitions to high), transmission gate 118 decouples D 102 from the master circuit, and transmission gate 120 cross-couples the output of inverter 124 to NAND gate 122. Thus the logical value present on D 102 becomes latched in the master circuit of flip flop 100.

As active use of flip flop 100 continues, opposite clocks PHI 104 and PHIB 106 also control the transfer of the logical value latched in the master circuit of flip flop 100 into the slave circuit. After clock PHIB 106 transitions to low (and clock PHI 104 transitions to high), the logical value latched in the master circuit is provided through transmission gate 142 to inverter 148. The output of inverter 148 is inverted by NAND gate 146, which outputs a signal that is blocked by transmission gate 144. When clock PHIB 106 transitions back to high, (and clock PHI 104 transitions back to low), the master circuit of flip flop 100 is again decoupled from the slave circuit. NAND gate 146 becomes cross-coupled to inverter 148 through transmission gates 174 and 144, and thus the logical value previously latched in the master circuit is latched in the slave circuit. The logical value available on Q 150 will remain stable unless the logical value present on D 102 changes and opposite clocks PHIB 106 and PHI 104 cause flip flop 100 to eventually pass on the new logical value through the master and slave circuits.

While not in active use, i.e. while VDD 114 is turned on but opposite clocks PHIB 106 and PHI 104 are not operating to pass on a new logical value, flip flop 100 will retain a stored value indefinitely. However, in doing so flip flop 100 will have a continuous current leakage through transistors in the master and slave circuits, leading to significant power loss. To avoid the power loss, flip flop 100 can be put in a sleep mode, i.e. VDD 114 may be turned off after transferring the logical value latched in the master and slave circuits to the balloon circuit through operation of sleep signals B1 156, B1B 158, B2 152, and B2B 154. In the sleep mode power loss is reduced because the balloon circuit has fewer transistors than the master and slave circuits. Power loss is also reduced because the balloon circuit has high threshold voltage transistors in region 178.

To put flip flop 100 into a sleep mode while not in active use, supply voltage VDDB 176 remains on and sleep signal B1 156 is pulsed low (and B1B 158 is pulsed high) so that transmission gate 172 couples the slave circuit to the balloon circuit. A logical value stored in the slave circuit is thus transferred to inverter 168. Sleep signal B2 152, synchronized to the rising edge of the pulse of sleep signal B1 156, is then pulled high (and B2B 154 is then pulled low) so that transmission gate 174 decouples NAND gate 146 and inverter 148 in the slave circuit, and so that inverters 166 and 168 are cross-coupled through transmission gate 170. Thus, the logical value is latched in the balloon circuit, and VDD 114 can be turned off. To restore flip flop 100 to active use, VDD 114 can be restored and the sleep mode signals B1 156, B1B 158, B2 152, and B2B 154 can operate to transfer the logical value retained in the balloon circuit back to the slave circuit.

Conventional balloon flip flop 100 thus stores data in master and slave circuits during active use, and retains stored data in the balloon circuit during the sleep mode. Unfortunately, flip flop 100 suffers from increased complexity and risk of error from the timing relationship between synchronized sleep signals B1 156, B1B 158, B2 152, and B2B 154. In particular, while exiting the sleep mode, when sleep signal B1 156 is pulsed low (and B1B 158 is pulsed high), thereby coupling the balloon circuit to the slave circuit, a charge sharing error can occur which may interfere with stored data in the balloon circuit. Also, prior to entering the sleep mode, node 164 and the outputs of inverters 166 and 168 may float at unknown voltage potentials, which may cause significant power loss. Furthermore, the addition of inverters 166 and 168, as well as transmission gates 170, 172, and 174 imposes a high cost in terms of added components and circuit complexity, in comparison to a conventional flip flop lacking a balloon circuit for data retention.

Figure 2:
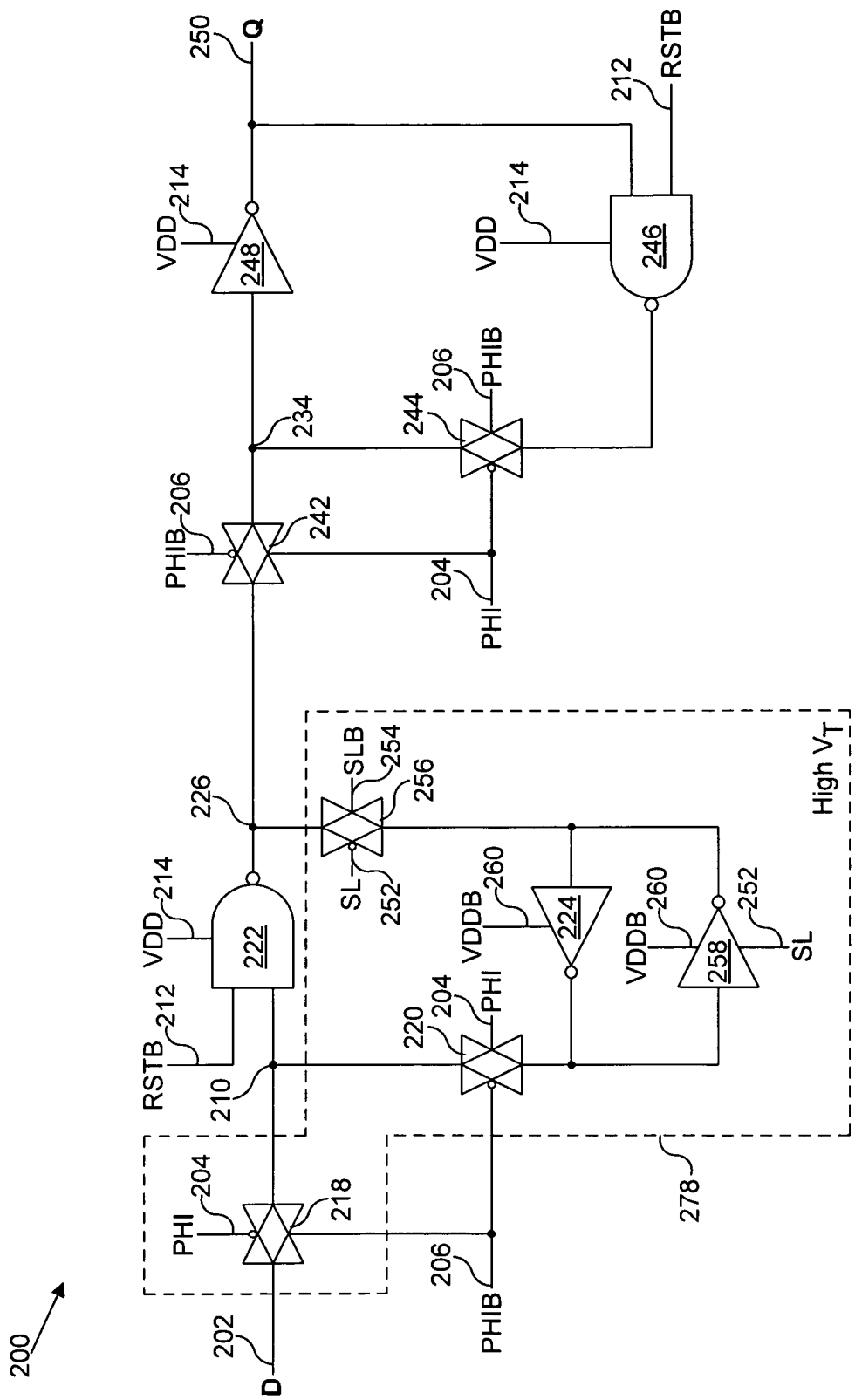
FIG. 2 shows a data retention flip flop, according to one embodiment of the present invention.
Figure 3:
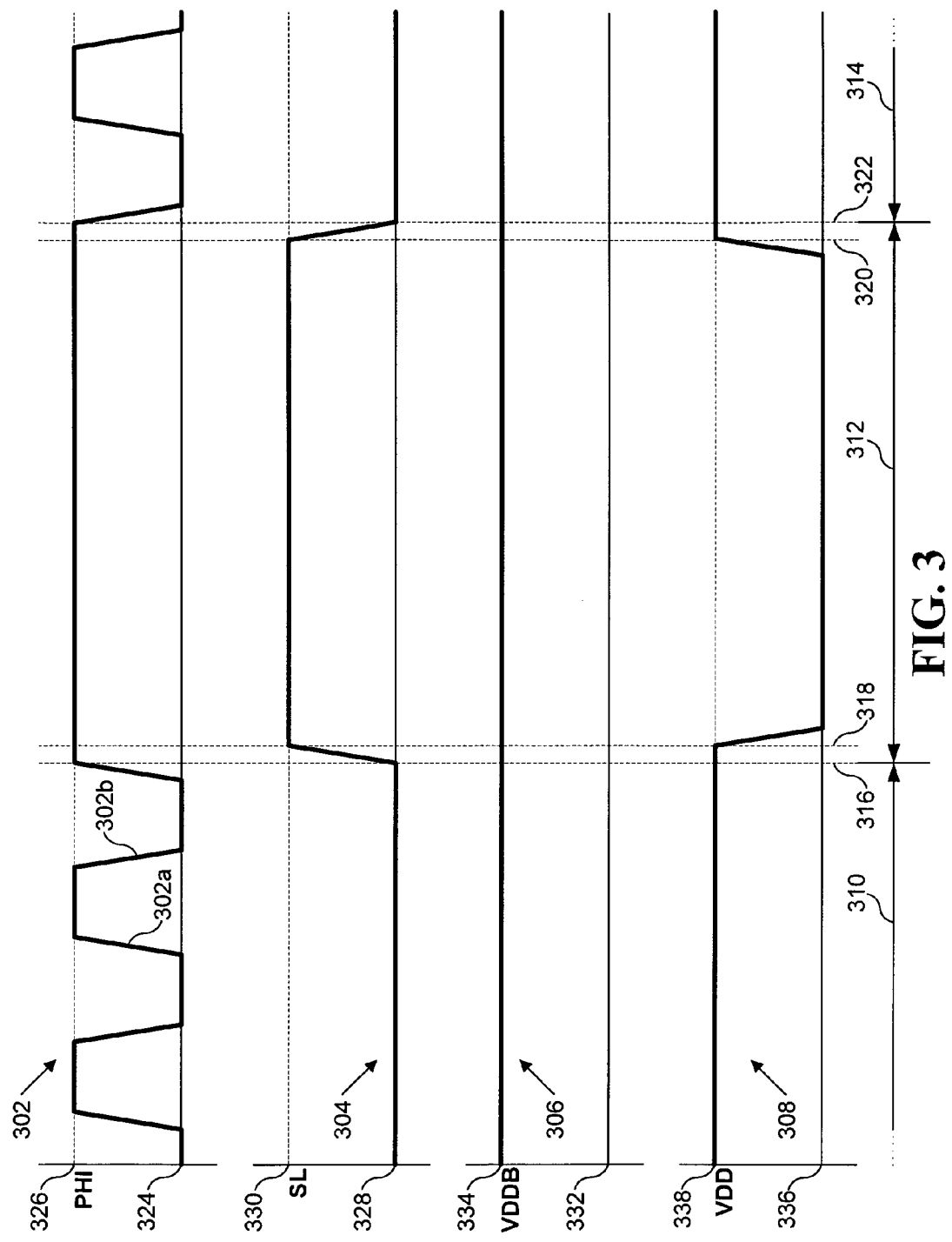
FIG. 3 shows timing diagrams for a data retention flip flop, according to one embodiment of the present invention.

Flip flop 200, in accordance with one embodiment of the present invention, is shown in FIG. 2. Timing diagrams 302, 304, 306, and 308, illustrating voltages and signals applied to flip flop 200, are shown in FIG. 3. Flip flop 200 includes transmission gates 218, 220, 242, 244, and 256. Flip flop 200 additionally includes NAND gates 222 and 246, inverters 224 and 248, and tri-statable inverter 258. Transmission gates 218 and 220, NAND gate 222, and inverter 224 comprise a master circuit of flip flop 200, while transmission gates 242 and 244, NAND gate 246, and inverter 248 comprise a slave circuit of flip flop 200. Inverter 224 in the master circuit is "a common sub-circuit" shared with an "always-on balloon circuit" of flip flop 200. The always-on balloon circuit also comprises transmission gate 256 and tri-statable inverter 258; tri-statable inverter 258 is an independent sub-circuit of the always-on balloon circuit that is not shared with the master circuit.

Flip flop 200 receives an input signal on D 202, and provides an output signal on Q 250. NAND gates 222 and 246, inverter 248, and other components in the master and slave circuits of flip flop 200 whose supply voltage lines are not specifically shown receive main supply voltage VDD 214, at voltage level 338 above a ground voltage level 336, which is depicted in timing diagram 308 of FIG. 3, and discussed further below. Inverter 224, tri-statable inverter 258, and other components in the always-on balloon circuit of flip flop 200 whose supply voltage lines are not specifically shown receive always-on supply voltage VDDB 260, at voltage level 334 above a ground voltage level 332, which is depicted in timing diagram 306 of FIG. 3, and also discussed further below. NAND gates 222 and 246 are also coupled to reset signal RSTB 212 as shown in FIG. 2.

Transmission gates 218, 220, 242, and 244 are controlled by opposite clock signals PHI 204 and PHIB 206; PHI 204 is depicted in timing diagram 302 of FIG. 3, and varies between voltage levels 326 and 324 (opposite clock signal PHIB 206 is not depicted in FIG. 3, but it is understood to those skilled in the art that clock signal PHIB 206 is generally an inverse of clock signal PHI 204). Tri-statable inverter 258 and transmission gate 256 are controlled by opposite sleep signals SL 252 and SLB 254. SL 252 is depicted in timing diagram 304 of FIG. 3, and varies between voltage levels 330 and 328 (sleep signal SLB 254 is not depicted in FIG. 3, but it is understood to those skilled in the art that sleep signal SLB 254 is generally an inverse of sleep signal SL 252). Clock signals PHI 204 and PHIB 206 and sleep signals SL 252 and SLB 254 are discussed further below. Signal SL 252 and/or its opposite signal SLB 254 are also referred to as "single sleep signal(s)" individually or collectively in the present application since the present invention relies on a single sleep signal (including its complement or opposite signal).

As with flip flop 100, typically transmission gates 218, 220, 242, 244, and 256 are each implemented with a pair of NMOS and PMOS transistors, although the transmission gates may be implemented differently, for example, with a single transistor, as known in the art. In the present example, transmission gate 218, for example, comprises an NMOS transistor and a PMOS transistor with sources coupled to D 202, drains coupled to node 210, the PMOS gate coupled to clock PHI 204, and the NMOS gate coupled to clock PHIB 206. The sources, drains, and gates of transmission gates 220, 242, 244, and 256 are similarly configured.

In operation, for example during operational period 310, flip flop 200 is turned on when main supply voltage VDD 214 is at voltage level 338 and VDDB 260 is at voltage level 334. While flip flop 200 is turned on, the master and slave circuits can store data and can be reset to store a logical zero value at output Q 250 by pulling RSTB 212 low. While flip flop 200 is turned on and in active use, a logical value present on D 202 will be stored in flip flop 200 and available on Q 250 in synchronization with clock signals PHIB 206 and PHI 204. Furthermore, during active use, sleep signal SL 252 will be held low (and SLB 254 will be held high) so that transmission gate 256 cross-couples NAND gate 222 and inverter 224, and so that tri-statable inverter 258 is disabled, i.e. an open circuit.

While flip flop 200 is in active use, opposite clocks PHI 204 (shown in timing diagram 302) and PHIB 206 control the latching of a logical value present on D 202 into the master circuit of flip flop 200. When PHI 204 is low prior to clock rising edge 302a, transmission gate 218 couples D 202 to node 210, allowing a logical value present on D 202 to propagate to NAND gate 222. The output of NAND gate 222 is provided through node 226 and transmission gate 256 to inverter 224, which outputs a signal that is blocked by transmission gate 220. When clock PHI 204 transitions from low to high at clock rising edge 302a (and PHIB 206 transitions from high to low), transmission gate 218 decouples D 202 from the master circuit, and transmission gate 220 cross-couples the output of inverter 224 to NAND gate 222. Thus, the logical value present on D 202 prior to clock rising edge 302a becomes latched in the master circuit of flip flop 200. Because SL 252 is held low during operational period 310, disabled tri-statable inverter 258 does not affect the latching described above.

As active use of flip flop 200 continues, opposite clocks PHI 204 and PHIB 206 also control the transfer of the logical value latched in the master circuit of flip flop 200 into the slave circuit. After clock PHI 204 transitions from low to high (and clock PHIB 206 transitions from high to low), i.e. after clock rising edge 302a, the logical value latched in the master circuit is provided through transmission gate 242 and node 234 to inverter 248. The output of inverter 248 is inverted by NAND gate 246, which outputs a signal that is blocked by transmission gate 244. When clock PHI 204 transitions back to low (and clock PHIB 206 transitions back to high), i.e. makes a high-to-low transition as depicted in clock falling edge 302b, the master circuit of flip flop 200 is again decoupled from the slave circuit. NAND gate 246 becomes cross-coupled to inverter 248 through transmission gate 244, and thus the logical value previously latched in the master circuit is latched in the slave circuit. The value available on Q 250 will remain stable unless the logical value present on D 202 changes and opposite clocks PHIB 206 and PHI 204 cause flip flop 200 to eventually pass on the new logical value through the master and slave circuits.

While not in active use, i.e. while VDD 214 is turned on but opposite clocks PHIB 206 and PHI 204 are not operating to pass on a new logical value, flip flop 200 will retain a stored value indefinitely. However, retaining a stored value while flip flop 200 is turned on will result in a continuous current leakage through transistors in the master and slave circuits, leading to significant power loss. To avoid the power loss, flip flop 200 can be put in a sleep mode, i.e. can enter sleep period 312, and VDD 214 can be turned off after transferring the logical value latched in the master and slave circuits to the always-on balloon circuit through operation of signals SL 252 and SLB 254.

To put flip flop 200 into a sleep mode while not in active use, i.e. during sleep period 312, PHI 204 is held high (and PHIB 206 is held low) at time 316, as shown in timing diagram 302. Subsequently, between time 316 and 318, SL 252 is activated by holding SL 252 high (and SLB 254 is held low) as shown in timing diagram 304. When signals SL 252 and SLB 254 are so operated, transmission gate 256 becomes an open circuit, and tri-statable inverter 258 is enabled, i.e. changes from an open circuit to an inverter. Consequently, the logical value latched in the master circuit prior to sleep period 312 becomes latched in the always-on balloon circuit comprising inverter 224 and tri-statable inverter 258, and transmission gate 256 blocks NAND gate 222 from cross-coupling to, or interfering with, the always-on balloon circuit. VDD 214 can thus be turned off after time 318, as shown in timing diagram 308. Notably, the logical value latched in the always-on balloon circuit is maintained on node 210 via transmission gate 220. VDDB 260, turned on during operational period 310, remains on during sleep period 312, as shown in timing diagram 306.

During sleep period 312, power loss in flip flop 200 is reduced in part because the always-on balloon circuit has fewer transistors than the combined master and slave circuits. Because VDD 214 is turned off, i.e. held at ground voltage level 336, the master and slave circuits have no leakage current, or substantially no leakage current. Power loss is also reduced in the sleep mode by advantageous fabrication of the always-on balloon circuit using high threshold voltage transistors, shown as region 278 in FIG. 2. While not in the sleep mode, some embodiments of the invention's flip flop 200 maintain a high speed during active use, i.e. in operational periods 310 and 314, by fabricating the master and slave circuits using low threshold voltage transistors. Notably, because the always-on balloon circuit shares a common sub-circuit (in this embodiment inverter 224) with the master circuit, the invention's flip flop 200 can be fabricated with fewer overall transistors than conventional flip flop 100.

To return flip flop 200 to active use in operational period 314, after sleep period 312, the logical value retained in the always-on balloon circuit is latched back into the master and slave circuits. Specifically, while VDDB 260 remains turned on, as shown in timing diagram 306, VDD 214 is turned back on at time 320, thus preparing NAND gates 222 and 246 and inverter 248 for active use. The logical value maintained on node 210 by the always-on balloon circuit via transmission gate 220 thus propagates through NAND gate 222, transmission gate 242, and inverter 248 to Q 250. Between time 320 and 322, SL 252 is deactivated by holding SL 252 low (SLB 254 is held high) as shown in timing diagram 304. When signals SL 252 and SLB 254 are so operated, tri-statable inverter 258 is disabled, i.e. changes from an inverter to an open circuit, and transmission gate 256 cross-couples NAND gate 222 and inverter 224. The logical value latched in the always-on balloon circuit during sleep period 312 is thus latched back into the master circuit. Subsequently, after time 322 opposite clocks PHI 204 (shown in timing diagram 302) and PHIB 206 may resume causing flip flop 200 to pass along logical values through the master and slave circuits.

In this manner, the invention's flip flop 200 can retain a stored logical value while not in active use, i.e. while in a sleep mode, without resulting in a significant power loss. Also, the invention's flip flop 200 does not suffer increased complexity and risk of error from the timing relationship between multiple synchronized sleep signals. Further, the invention's flip flop 200 maintains a high speed when the flip flop is in active use. As discussed above, these advantages are achieved in part by turning off the main supply voltage provided to the master and slave circuits during the sleep mode, and also by the advantageous fabrication of the always-on balloon circuit with high threshold voltage transistors and by fabrication of the master and slave circuits with low threshold voltage transistors. Notably, because during the sleep mode the logical value latched in the always-on balloon circuit is maintained on node 210, there is no need for the high threshold voltage transistors of the always-on balloon circuit to drive retained data back into the high threshold voltage transistors of the master and slave circuits. Moreover, in contrast to conventional techniques, the present invention utilizes fewer transistors for implementation of the balloon circuit and also results in simplification of timing and timing related circuitry for the transferring of data to and from the balloon circuit.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A data retention flip flop comprising:
    master and slave circuits configured to be turned off when a single sleep mode signal is activated;
    said master circuit writing into an always-on balloon circuit when said single sleep mode signal is activated, wherein said always-on balloon circuit comprises only high threshold voltage transistors and said always-on balloon circuit is controlled by said single sleep mode signal;
    said master circuit reading from said always-on balloon circuit when said single sleep mode signal is deactivated.

2. The data retention flip flop of claim 1, wherein said slave circuit comprises low threshold voltage transistors.

3. The data retention flip flop of claim 1, wherein said master and slave circuits are configured to receive a main supply voltage and said always-on balloon circuit is configured to receive an always-on supply voltage.

4. The data retention flip flop of claim 1, wherein said data retention flip flop comprises at least one tri-statable inverter.

5. A data retention flip flop comprising:
    master and slave circuits configured to be turned off when a single sleep mode signal is activated;
    an always-on balloon circuit coupled to said master circuit, wherein said always-on balloon circuit comprises only high threshold voltage transistors and said always-on balloon circuit is controlled by said single sleep mode signal;
    said always-on balloon circuit comprising a common sub-circuit shared with said master circuit;
    said master circuit writing into said always-on balloon circuit when said single sleep mode signal is activated;
    said master circuit reading from said always-on balloon circuit when said single sleep mode signal is deactivated.

6. The data retention flip flop of claim 5, wherein said slave circuit comprises low threshold voltage transistors.

7. The data retention flip flop of claim 5, wherein said master and slave circuits are configured to receive a main supply voltage and said always-on balloon circuit is configured to receive an always-on supply voltage.

8. The data retention flip flop of claim 5, wherein said common sub-circuit comprises at least one inverter.

9. The data retention flip flop of claim 5, wherein said always-on balloon circuit further comprises an independent sub-circuit not shared with said master circuit.

10. The data retention flip flop of claim 9, wherein said independent sub-circuit is enabled when said single sleep mode signal is activated.

11. The data, retention flip flop of claim 9, wherein said independent sub-circuit comprises a tri-statable inverter that is enabled when said single sleep mode signal is activated.

* * * * *